(12) United States Patent
Wang et al.

(10) Patent No.: US 12,176,367 B2
(45) Date of Patent: Dec. 24, 2024

(54) SEMICONDUCTOR DEVICE

(71) Applicant: VisEra Technologies Company Limited, Hsin-Chu (TW)

(72) Inventors: Wei-Ko Wang, Taoyuan (TW); Pei-Yi Hsiao, Zhubei (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 530 days.

(21) Appl. No.: 17/032,957

(22) Filed: Sep. 25, 2020

(65) Prior Publication Data

US 2022/0102409 A1 Mar. 31, 2022

(51) Int. Cl.
*H01L 27/146* (2006.01)

(52) U.S. Cl.
CPC .. *H01L 27/14623* (2013.01); *H01L 27/14649* (2013.01); *H01L 27/14627* (2013.01)

(58) Field of Classification Search
CPC ......... H01L 27/14623; H01L 27/14649; H01L 27/14627; H01L 27/14625
See application file for complete search history.

(56) References Cited

U.S. PATENT DOCUMENTS

| 4,956,304 | A  | * | 9/1990  | Cockrum | H01L 31/1832 |
|           |    |   |         |         | 257/E31.058 |
| 6,759,646 | B1 | * | 7/2004  | Acharya | H04N 25/134 |
|           |    |   |         |         | 250/226 |
| 8,101,901 | B2 | * | 1/2012  | Toda    | H01L 31/02165 |
|           |    |   |         |         | 257/E31.046 |
| 8,139,141 | B2 | * | 3/2012  | Bamji   | H04N 23/54 |
|           |    |   |         |         | 348/335 |
| 8,581,964 | B2 | * | 11/2013 | Sul     | H01L 31/02162 |
|           |    |   |         |         | 348/46 |
| 9,679,933 | B2 | * | 6/2017  | Huang   | H01L 27/1464 |
| 10,186,545 | B2 | * | 1/2019  | Lee    | H01L 27/14649 |
| 2001/0031405 | A1 | * | 10/2001 | Phillips | G02B 5/223 |
|           |    |   |         |         | 430/7 |
| 2006/0124833 | A1 | * | 6/2006 | Toda   | H01L 27/14685 |
|           |    |   |         |         | 250/214 R |
| 2008/0067330 | A1 | * | 3/2008 | Yamamoto | H01L 27/14621 |
|           |    |   |         |         | 264/1.36 |

(Continued)

FOREIGN PATENT DOCUMENTS

| CN | 1574383 A | 2/2005 |
|----|-----------|--------|
| CN | 110323238 A | 10/2019 |

(Continued)

*Primary Examiner* — Jarrett J Stark
(74) *Attorney, Agent, or Firm* — Muncy, Geissler, Olds & Lowe, P.C.

(57) ABSTRACT

A semiconductor device is provided. The semiconductor device includes a substrate having a plurality of first photoelectric conversion elements and a plurality of second photoelectric conversion elements. The semiconductor device also includes a light-adjusting structure disposed on the substrate. The light-adjusting structure includes a patterned multi-film having a plurality of trenches that correspond to the first photoelectric conversion elements. The first photoelectric conversion elements are used for sensing near infrared light, and the second photoelectric conversion elements are used for sensing visible light.

9 Claims, 10 Drawing Sheets

(56) References Cited

U.S. PATENT DOCUMENTS

| | | | | |
|---|---|---|---|---|
| 2009/0321640 | A1* | 12/2009 | Onogi | G02F 1/1362 |
| | | | | 250/208.2 |
| 2010/0164906 | A1* | 7/2010 | Fukunaga | G06F 3/042 |
| | | | | 345/175 |
| 2011/0001205 | A1* | 1/2011 | Sul | H01L 27/14627 |
| | | | | 257/E31.127 |
| 2011/0013055 | A1* | 1/2011 | Sul | H01L 27/14625 |
| | | | | 348/E5.091 |
| 2014/0300589 | A1* | 10/2014 | Tanaka | G06F 3/03542 |
| | | | | 349/12 |
| 2016/0315112 | A1* | 10/2016 | Park | H01L 27/14623 |
| 2017/0010528 | A1* | 1/2017 | Takishita | G03F 7/027 |
| 2017/0023858 | A1* | 1/2017 | Takishita | H01L 27/14649 |
| 2017/0166762 | A1* | 6/2017 | Tomeba | C09D 5/32 |
| 2018/0039171 | A1* | 2/2018 | Oota | H01L 27/144 |
| 2018/0057690 | A1* | 3/2018 | Mori | H01L 27/14625 |
| 2019/0185656 | A1* | 6/2019 | Ogawa | C08L 33/10 |
| 2019/0228204 | A1* | 7/2019 | Park | G06V 40/1335 |
| 2020/0006414 | A1* | 1/2020 | Hamada | G02B 1/118 |
| 2020/0013821 | A1* | 1/2020 | Oota | H01L 27/1462 |
| 2020/0225580 | A1* | 7/2020 | Hamada | G03F 7/0295 |
| 2021/0072589 | A1* | 3/2021 | Taguchi | G02F 1/133514 |
| 2021/0108103 | A1* | 4/2021 | Ishikawa | C08F 299/024 |
| 2021/0132261 | A1* | 5/2021 | Wang | H10K 59/38 |
| 2021/0139690 | A1* | 5/2021 | Oya | C08L 35/02 |
| 2021/0225956 | A1* | 7/2021 | Yu | H10K 59/38 |
| 2022/0010121 | A1* | 1/2022 | Kato | G02B 1/04 |
| 2022/0018992 | A1* | 1/2022 | Oya | C08F 290/12 |
| 2022/0102409 | A1* | 3/2022 | Wang | H01L 27/14649 |
| 2022/0206387 | A1* | 6/2022 | Hamada | C08K 3/22 |
| 2022/0213293 | A1* | 7/2022 | Taguchi | G03F 7/038 |
| 2022/0213296 | A1* | 7/2022 | Kaneko | G03F 7/105 |
| 2022/0227966 | A1* | 7/2022 | Kato | H01L 27/146 |
| 2022/0236462 | A1* | 7/2022 | Varghese | G02B 5/201 |

FOREIGN PATENT DOCUMENTS

| | | | |
|---|---|---|---|
| JP | H093311 A | * | 7/1997 |
| TW | 201733103 A | | 9/2017 |
| TW | 202011045 A | | 3/2020 |

* cited by examiner

SEMICONDUCTOR DEVICE

BACKGROUND

Technical Field

Embodiments of the present disclosure relate to a semiconductor device, and in particular they relate to a semiconductor device that includes a photoelectric conversion element used for sensing near infrared light.

Description of the Related Art

In recent years, semiconductor devices with photoelectric conversion element are often used as biometric devices, and these biometric devices have been widely applied in various fields. A biometric device may use people's intrinsic physical characteristics (e.g., a fingerprint, a face, an iris, and so on) to verify their identification. For example, a biometric device may be used as a fingerprint identification device, a facial-recognition device, or an iris scanner used in portable devices (e.g., cell phones, tablet computers, notebooks, and so on). This application of biometric devices brings users a safe and convenient user experience.

However, with the advancement of science and technology, the security of biometric technology is gradually being challenged. That is, fake human characteristics may be made from artificial materials. For example, a fake finger may be made by 3D printing, so that existing biometric devices (e.g., fingerprint identification devices) may not be able to distinguish between the fingerprint of the fake finger and the fingerprint of a real finger.

SUMMARY

In general, biometric devices capture an image of human characteristics in visible light only. It is difficult to distinguish between the image from fake human characteristics and from real human characteristics by visible light.

The semiconductor device according to the embodiments of the present disclosure includes a photoelectric conversion element used for sensing near infrared light and another photoelectric conversion element used for sensing visible light. That is, the semiconductor device according to the embodiments of the present disclosure may capture the image of the human characteristics by near infrared light and visible light, so that the image from fake human characteristics may be distinguished easier, thereby effectively enhancing the safety of the semiconductor device.

Some embodiments of the present disclosure include a semiconductor device. The semiconductor device includes a substrate having a plurality of first photoelectric conversion elements and a plurality of second photoelectric conversion elements. The semiconductor device also includes a light-adjusting structure disposed on the substrate. The light-adjusting structure includes a patterned multi-film having a plurality of trenches that correspond to the first photoelectric conversion elements. The first photoelectric conversion elements are used for sensing near infrared light, and the second photoelectric conversion elements are used for sensing visible light.

In some embodiments, the sensing time of the first photoelectric conversion elements during a predetermined period is shorter than the sensing time of the second photoelectric conversion elements during the predetermined period.

In some embodiments, the light-adjusting structure further includes a light-collimating layer disposed on the patterned multi-film.

In some embodiments, the light-collimating layer includes a first light-shielding layer having a plurality of first holes that correspond to the first photoelectric conversion elements and a plurality of second holes that correspond to the second photoelectric conversion elements.

In some embodiments, the light-adjusting structure further includes a plurality of light filter portions disposed in the trenches.

In some embodiments, the light-collimating layer further includes a plurality of light-transmitting portions disposed in the first holes and in the second holes.

In some embodiments, the light-adjusting structure further includes a plurality of light filter portions disposed in the first holes.

In some embodiments, the light-collimating layer further includes a plurality of light-transmitting portions disposed in the trenches and in the second holes.

In some embodiments, the semiconductor device further includes a condensing structure disposed on the light-collimating layer.

In some embodiments, the condensing structure includes a second light-shielding layer having a plurality of third holes that correspond to the first photoelectric conversion elements and the second photoelectric conversion elements; the condensing structure also includes a plurality of microlenses disposed in the third holes; the condensing structure further includes a transparent layer disposed between the light-collimating layer and the second light-shielding layer.

In some embodiments, the light-adjusting structure further includes a light-collimating layer disposed between the substrate and the patterned multi-film.

In some embodiments, the semiconductor device further includes a condensing structure disposed on the patterned multi-film.

In some embodiments, the condensing structure includes a second light-shielding layer having a plurality of third holes that correspond to the first photoelectric conversion elements and the second photoelectric conversion elements; the condensing structure also includes a plurality of microlenses disposed in the third holes; the condensing structure further includes a transparent layer disposed between the patterned multi-film and the second light-shielding layer.

In some embodiments, the first photoelectric conversion elements are used for sensing a band of an electromagnetic spectrum with wavelength from 700 nm to 1100 nm.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

The semiconductor device in the embodiments of the present disclosure may be used as a biometric device, such as a fingerprint identification device, but the present disclosure is not limited thereto. The semiconductor device shown in the embodiments of the present disclosure may also be applied to other suitable devices, depending on requirements.

Figure 1:
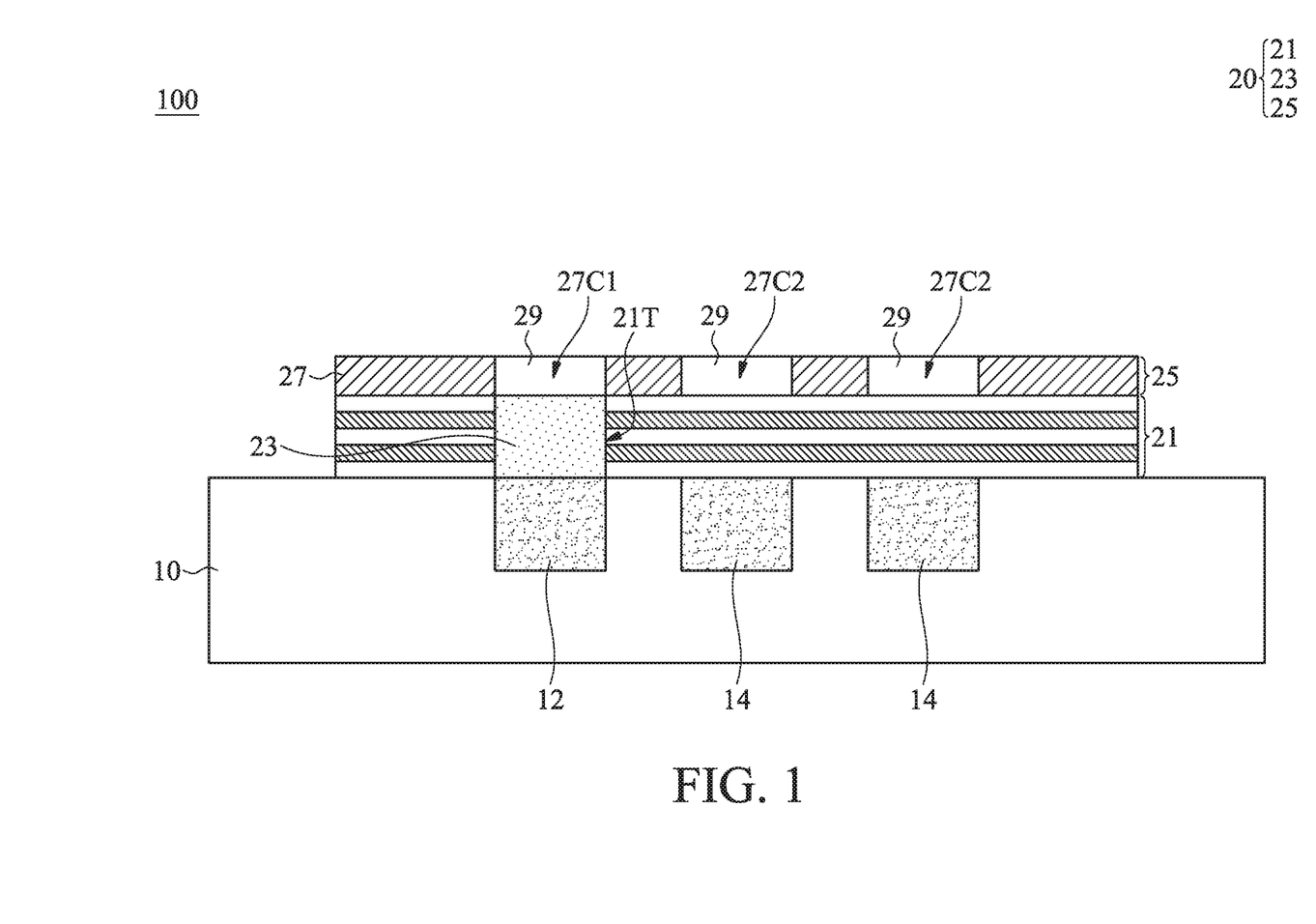
FIG. 1 is a partial cross-sectional view illustrating a semiconductor device according to an embodiment of the present disclosure.

FIG. 1 is a partial cross-sectional view illustrating a semiconductor device 100 according to an embodiment of the present disclosure. It should be noted that some components may be omitted in FIG. 1, for the sake of brevity.

Referring to FIG. 1, the semiconductor device includes a substrate 10. In some embodiments, the material of the substrate 10 may include an elemental semiconductor (e.g., silicon, germanium), a compound semiconductor (e.g., tantalum carbide (TaC), gallium arsenide (GaAs), indium arsenide (InAs) or indium phosphide (InP)), an alloy semiconductor (e.g., silicon germanium (SiGe), silicon germanium carbide (SiGeC), gallium arsenic phosphide (GaAsP) or gallium indium phosphide (GaInP)), any other applicable semiconductor, or a combination thereof, but the present disclosure is not limited thereto.

In some embodiments, the substrate 10 may be a semiconductor-on-insulator (SOI) substrate. For example, the substrate 10 may be a silicon-on-insulator substrate, but the present disclosure is not limited thereto. In some embodiments, the substrate 10 may be a semiconductor wafer (e.g., a silicon wafer, or any other applicable semiconductor wafer). In some embodiments, the substrate 10 may include various conductive features (e.g., conductive lines or vias). For example, the conductive features may be made of aluminum (Al), copper (Cu), tungsten (W), an alloy thereof, any other applicable conductive material, or a combination thereof, but the present disclosure is not limited thereto.

As shown in FIG. 1, the substrate 10 may have a plurality of first photoelectric conversion elements 12 (only one first photoelectric conversion element 12 is shown in FIG. 1) and a plurality of second photoelectric conversion elements 14. In some embodiments, the first photoelectric conversion elements 12 and the second photoelectric conversion elements 14 may be formed by a process such as an ion implantation process and/or a diffusion process. For example, the first photoelectric conversion elements 12 and the second photoelectric conversion elements 14 may be configured to form transistors, photodiodes, PIN diodes and/or light-emitting diodes, but the present disclosure is not limited thereto.

In the embodiments of the present disclosure, the first photoelectric conversion elements 12 and the second photoelectric conversion elements 14 are different. In more detail, the first photoelectric conversion elements 12 are used for sensing near infrared light (e.g., a band of an electromagnetic spectrum with wavelength from 700 nm to 1100 nm), and the second photoelectric conversion elements are used for sensing visible light (e.g., a band of an electromagnetic spectrum with wavelength from 400 nm to 700 nm), but the present disclosure is not limited thereto.

In some embodiments, the first photoelectric conversion elements 12 and the second photoelectric conversion elements 14 may form an array structure, and the number of first photoelectric conversion elements 12 and the number of second photoelectric conversion elements 14 may be different. For example, the ratio of the number of first photoelectric conversion elements 12 to the number of second photoelectric conversion elements 14 may be 1/3 to 1/9999, but the present disclosure is not limited thereto.

Referring to FIG. 1, the semiconductor device 100 includes a light-adjusting structure 20 disposed on the substrate 10. As shown in FIG. 1, the light-adjusting structure may include a patterned multi-film 21 and a plurality of light filter portions 23 (only one light filter portion 23 is shown in FIG. 1). In particular, a patterned multi-film 21 may be disposed on the substrate 10, and the light filter portions 23 may be disposed to correspond to the first photoelectric conversion elements 12.

In the embodiments of the present disclosure, the patterned multi-film 21 and the light filter portions 23 are different filters. In particular, the patterned multi-film 21 may be a hybrid filter, which is capable of cutting the infrared (IR) light with the specific wavelength (e.g., about 700 nm to about 1,100 nm) and allowing the visible light with the specific wavelength (e.g., about 400 nm to about 700 nm) passing through. Instead, the light filter portions 23 are capable of cutting the visible light with the specific wavelength (e.g., about 400 nm to about 700 nm) and allowing the infrared (IR) light with the specific wavelength (e.g., about 700 nm to about 1,100 nm) passing through.

In some embodiments, the patterned multi-film 21 may be formed by a deposition process, such as chemical vapor deposition (CVD), atomic layer deposition (ALD), molecular beam epitaxy (MBE), liquid phase epitaxy (LPE), the like, or a combination thereof, but the present disclosure is not limited thereto. Similarly, the light filter portions 23 may also be formed by a deposition process.

As shown in FIG. 1, the patterned multi-film 21 may have a plurality of trenches 21T (only one trench 21 is shown in FIG. 1), and the light filter portions 23 are disposed in the trenches 21T, but the present disclosure is not limited thereto. In some embodiments, a patterning process may be performed on a multi-film to form the patterned multi-film 21. For example, a mask layer (not illustrated) may be disposed on a multi-film, and then an etching process may be performed to etch the multi-film to form trenches 21T (and to form the patterned multi-film 21) by using the mask layer as an etch mask; then, the light filter portions 23 may be deposited in the trenches 21T, but the present disclosure is not limited thereto.

In some embodiments, the mask layer may include a hard mask and may include silicon oxide ($SiO_2$), silicon nitride (SiN), silicon oxynitride (SiON), silicon carbide (SiC), silicon carbonitride (SiCN), the like, or a combination thereof, but the present disclosure is not limited thereto. The mask layer may be a single-layer structure or a multi-layer structure. The mask layer may be formed by a deposition process, a photolithography process, other suitable processes, or a combination thereof, but the present disclosure is not limited thereto. For example, the photolithography process may include photoresist coating (e.g., spin coating), soft baking, mask aligning, exposure, post-exposure baking (PEB), developing, rinsing, drying (e.g., hard baking), other suitable processes, or a combination thereof, but the present disclosure is not limited thereto.

In some embodiments, the etching process may include a dry etching process, a wet etching process, or a combination thereof. For example, the dry etching process may include reactive ion etch (RIE), inductively-coupled plasma (ICP) etching, neutral beam etching (NBE), electron cyclotron resonance (ERC) etching, the like, or a combination thereof, but the present disclosure is not limited thereto. For example, the wet etching process may use, for example, hydrofluoric acid (HF), ammonium hydroxide ($NH_4OH$), or any suitable etchant.

In some embodiment, user's characteristics (e.g., fingerprint) may reflect visible light and infrared (IR) light. Then, reflected infrared light may be sensed by the first photoelectric conversion elements 12 to produce an infrared-light image, and the reflected visible light may be sensed by the second photoelectric conversion elements 14 to produce a visible-light image. Here, infrared light and visible light may come from the apparatus to which the semiconductor device 100 is applied or from the outside (e.g., ambient light or sunlight), but the present disclosure is not limited thereto.

Figure 2A:
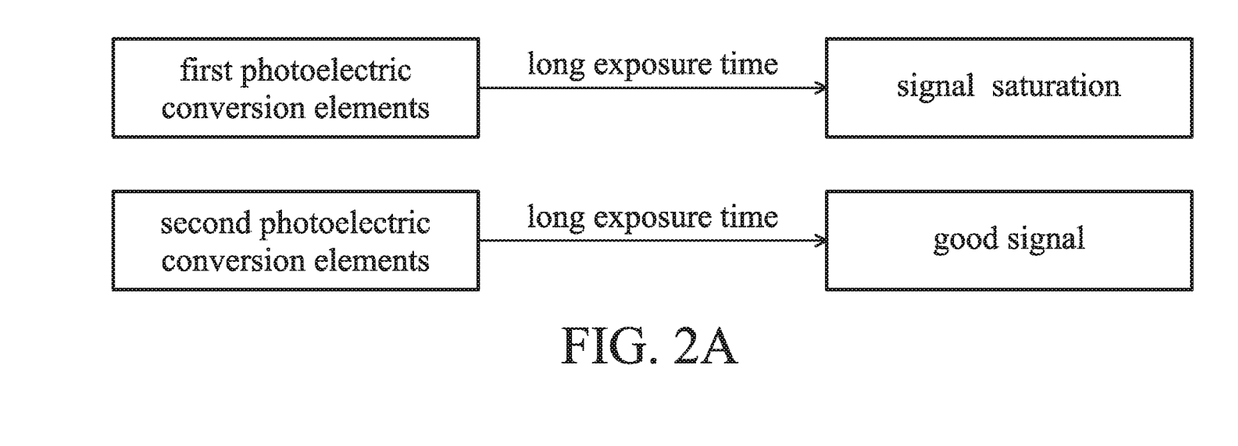
FIGS. 2A-2C are examples illustrating different states of exposure time.
Figure 2B:
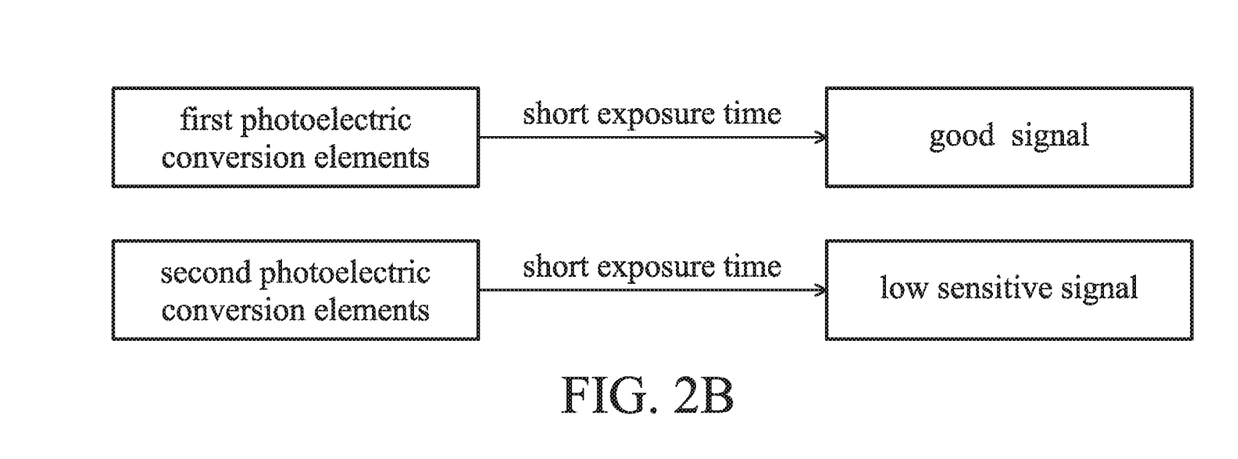
Figure 2C:
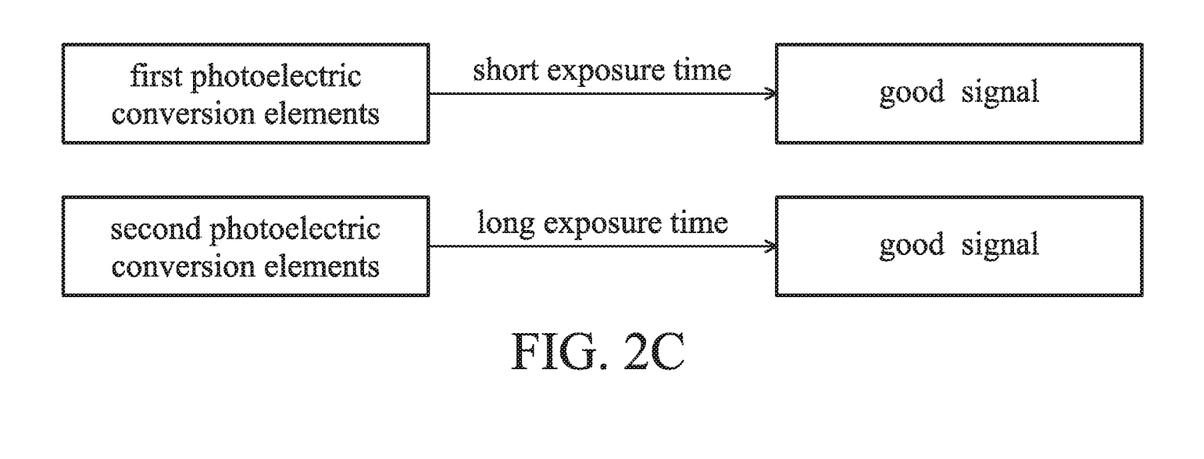

FIGS. 2A-2C are examples illustrating different states of exposure time. Referring to FIG. 2A, since the second photoelectric conversion elements 14 are used for sensing visible light, they need long exposure time to get an image with high quality (i.e., good signal). However, during a predetermined period, if the sensing time of the first photoelectric conversion elements 12 is the same as the sensing time of the second photoelectric conversion elements 14 (i.e., both the first photoelectric conversion elements 12 and the second photoelectric conversion elements 14 have long sensing time), then the first photoelectric conversion elements 12 would get an image with low quality because of signal saturation.

Moreover, referring to FIG. 2B, since the first photoelectric conversion elements 12 are used for sensing near infrared light, they need short exposure time to get an image with high quality (i.e., good signal). However, during a predetermined period, if the sensing time of the second photoelectric conversion elements 14 is the same as the sensing time of the first photoelectric conversion elements 12 (i.e., both the first photoelectric conversion elements 12 and the second photoelectric conversion elements 14 have short sensing time), then the second photoelectric conversion elements 14 would get an image with low quality because of low sensitive signal.

Therefore, referring to FIG. 2C, in the embodiments of the present disclosure, the sensing time of the first photoelectric conversion elements 12 during a predetermined period is shorter than the sensing time of the second photoelectric conversion elements 14 during the predetermined period, so that both the first photoelectric conversion elements 12 and the second photoelectric conversion elements 14 would get images with high quality (i.e., good signal).

Furthermore, even fake human characteristics may be made from artificial materials, the image from fake human characteristics by near infrared light may not be the same as the image from real human characteristics by near infrared light. Therefore, the semiconductor device 100 according to the embodiments of the present disclosure may be able to distinguish between the fake human characteristics and the real human characteristics, so that the safety of the semiconductor device 100 according to the embodiments of the present disclosure may be effectively enhanced.

Referring to FIG. 1, the light-adjusting structure 20 may also include a light-collimating layer 25 disposed on the patterned multi-film 21 (and on the light filter portions 23). In some embodiments, the light-collimating layer 25 may include a first light-shielding layer 27 and a plurality of light-transmitting portions 29. As shown in FIG. 1, the first light-shielding layer 27 may have a plurality of first holes 27C1 (only one first hole 27C1 is shown in FIG. 1) that correspond to the first photoelectric conversion elements 12 and a plurality of second holes 27C2 that correspond to the second photoelectric conversion elements 14, and the light-transmitting portions 29 may be disposed in the first holes 27C1 and the second holes 27C2, but the present disclosure is not limited thereto.

In some embodiments, the material of the first light-shielding layer 27 may include photoresist (e.g., black photoresist, or other applicable photoresist which is not transparent), ink (e.g., black ink, or other applicable ink which is not transparent), molding compound (e.g., black molding compound, or other applicable molding compound which is not transparent), solder mask (e.g., black solder mask, or other applicable solder mask which is not transparent), epoxy polymer, any other applicable material, or a combination thereof, but the present disclosure is not limited thereto. In some embodiments, the material of the first light-shielding layer 27 may include a light curing material, a thermal curing material, or a combination thereof.

In some embodiments, a patterning process may be performed on the material mentioned above to form the first holes 27C1 and the second holes 27C2 as shown in FIG. 1. For example, a mask layer (not illustrated) may be disposed on the material mentioned above, and then an etching process may be performed to form the first holes 27C1 and the second holes 27C2 by using the mask layer as an etch mask; then, the light-transmitting portions 29 may be deposited in the first holes 27C1 and the second holes 27C2, but the present disclosure is not limited thereto.

In some embodiments, the material of the light-transmitting portions 29 may include transparent photoresist, polyimide, epoxy resin, any other applicable material, or a combination thereof, but the present disclosure is not limited thereto. In the embodiments of the present disclosure, the light-transmitting portions 29 may be disposed to correspond to the first photoelectric conversion elements 12 and the second photoelectric conversion elements 14. For example, the first holes 27C1 and the second holes 27C2 may be respectively aligned with the first photoelectric conversion elements 12 and the second photoelectric conversion elements 14. That is, the light-transmitting portions 29 may be aligned with the first photoelectric conversion elements 12 and the second photoelectric conversion elements 14, but the present disclosure is not limited thereto.

In the embodiments of the present disclosure, the light-collimating layer 25 may be used to collimate light for reducing the energy lost due to light divergence. Therefore, the light-collimating layer 25 may be applied in the semiconductor device 100 (e.g., a biometric device) to enhance the efficiency of identification.

Figure 3:
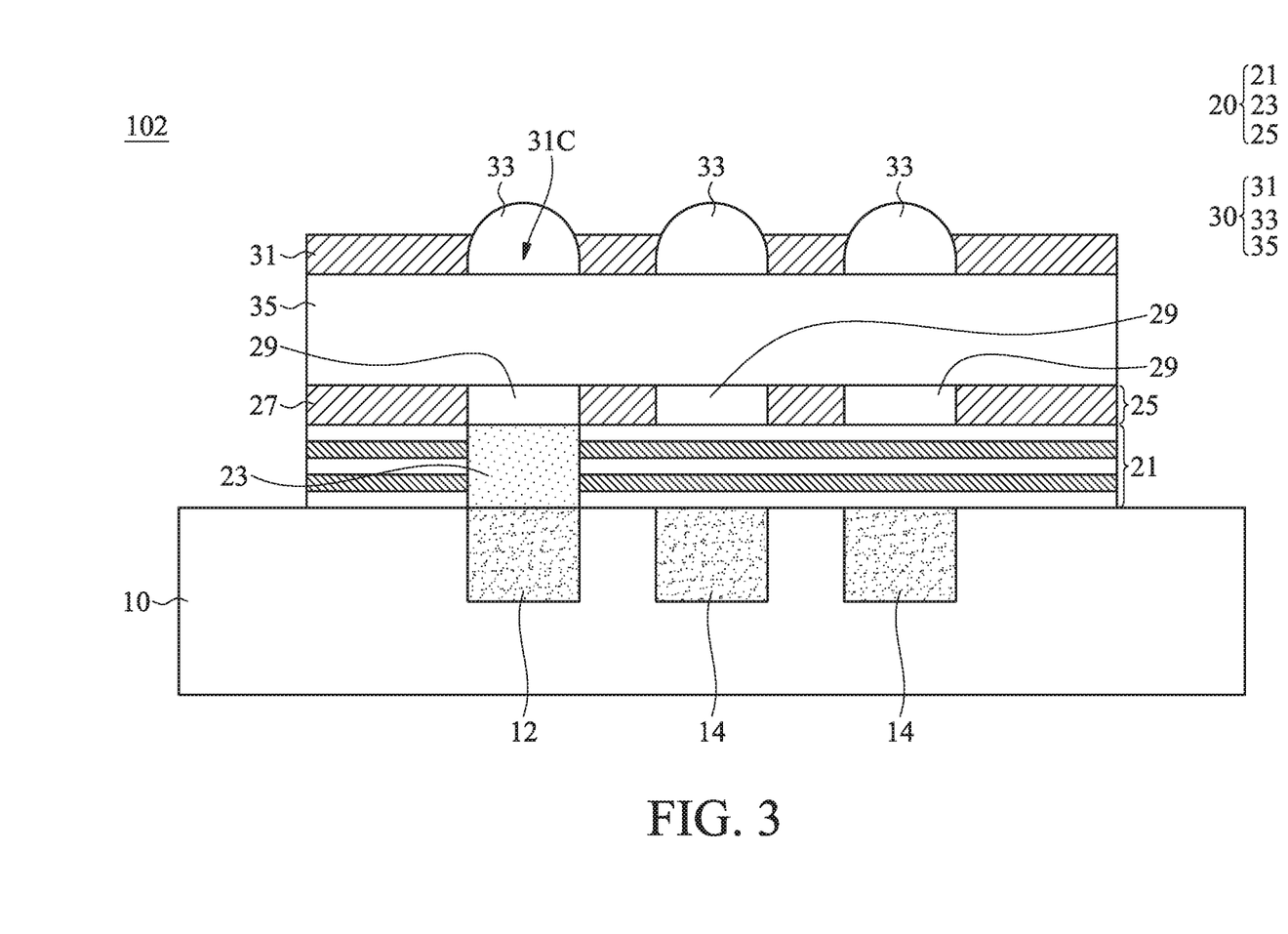
FIG. 3 is a partial cross-sectional view illustrating a semiconductor device according to another embodiment of the present disclosure.

FIG. 3 is a partial cross-sectional view illustrating a semiconductor device 102 according to another embodiment of the present disclosure. It should be noted that some components may be omitted in FIG. 3, for the sake of brevity.

Referring to FIG. 3, the semiconductor device 102 has a structure similar to the structure of the semiconductor device 100 shown in FIG. 1. The difference from the semiconductor device 100 shown in FIG. 1 is that the semiconductor device 102 shown in FIG. 3 may further include a condensing structure 30 disposed on the light-adjusting structure 20. In more detail, the condensing structure 30 is disposed on the light-collimating layer 25, but the present disclosure is not limited thereto.

In some embodiments, the condensing structure 30 may include a second light-shielding layer 31, a plurality of micro-lenses 33, and a transparent layer 35. As shown in FIG. 3, the second light-shielding layer 31 may have a plurality of third holes 31C that correspond to the first photoelectric conversion elements 12 and the second photoelectric conversion elements 14, the micro-lenses 33 may be disposed in the third holes 31C, and the transparent layer 35 may be disposed between the light-collimating layer 25 and the second light-shielding layer 31, but the present disclosure is not limited thereto.

In this embodiment, the micro-lenses 33 may be disposed to correspond to the light-transmitting portions 29. For example, the micro-lenses 33 (or the third holes 31C) may be aligned with the light-transmitting portions 29 (or the first holes 27C1 and the second holes 27C2), the first photoelectric conversion elements 12, and the second photoelectric conversion elements 14, but the present disclosure is not limited thereto.

In some embodiments, the material of the second light-shielding layer 31 may be the same as or similar to the material of the first light-shielding layer 27. For example, the material of the second light-shielding layer 31 may include photoresist (e.g., black photoresist, or other applicable photoresist which is not transparent), ink (e.g., black ink, or other applicable ink which is not transparent), molding compound (e.g., black molding compound, or other applicable molding compound which is not transparent), solder mask (e.g., black solder mask, or other applicable solder mask which is not transparent), epoxy polymer, any other applicable material, or a combination thereof, but the present disclosure is not limited thereto. In some embodiments, the material of the second light-shielding layer 31 may include a light curing material, a thermal curing material, or a combination thereof.

Similarly, a patterning process may be performed on the material mentioned above to form the third holes 31C as shown in FIG. 3. For example, a mask layer (not illustrated) may be disposed on the material mentioned above, and then an etching process may be performed to form third holes 31C by using the mask layer as an etch mask; then, the micro-lens 33 may be deposited in the third holes 31C, but the present disclosure is not limited thereto.

In some embodiments, the material of the micro-lens 33 may be a transparent material. For example, the material of the micro-lens 33 may include glass, epoxy resin, silicone resin, polyurethane, any other applicable material, or a combination thereof, but the present disclosure is not limited thereto. In some embodiments, the micro-lens 33 may be formed by a photoresist reflow method, a hot embossing method, any other applicable method, or a combination thereof. In some embodiments, the steps of forming the micro-lens 33 may include a spin coating process, a lithography process, an etching process, any other applicable process, or a combination thereof, but the present disclosure is not limited thereto.

In this embodiment, the micro-lens 33 may be a semi-convex lens or a convex lens, but the present disclosure is not limited thereto. In some embodiments, the micro-lens 33 may be formed as, for example, a circular cone, a quadrangular pyramid, a flat top cone, and so on, but the present disclosure is not limited thereto. Any other structure that can focus light may be used to replace the micro-lens 33 shown in FIG. 3.

Moreover, although FIG. 3 shows that the micro-lenses 33 may be disposed in the third holes 31C, the present disclosure is not limited thereto. In some other embodiments, the micro-lenses 33 may be disposed on or above the third holes 31C, and the third holes 31C may be filled with other transparent materials.

In some embodiments, the material of the transparent layer 35 may be the same as or similar to the material of the light-transmitting portions 29. For example, the material of the transparent layer 35 may include transparent photoresist, polyimide, epoxy resin, any other applicable material, or a combination thereof, but the present disclosure is not limited thereto.

In some embodiments, the condensing structure 30 may further focus infrared light or visible light reflected by user's characteristics, so that the first photoelectric conversion elements 12 or the second photoelectric conversion elements 14 may capture better images (i.e., the sensing ability of the semiconductor device 102 may be further enhanced).

Figure 4:
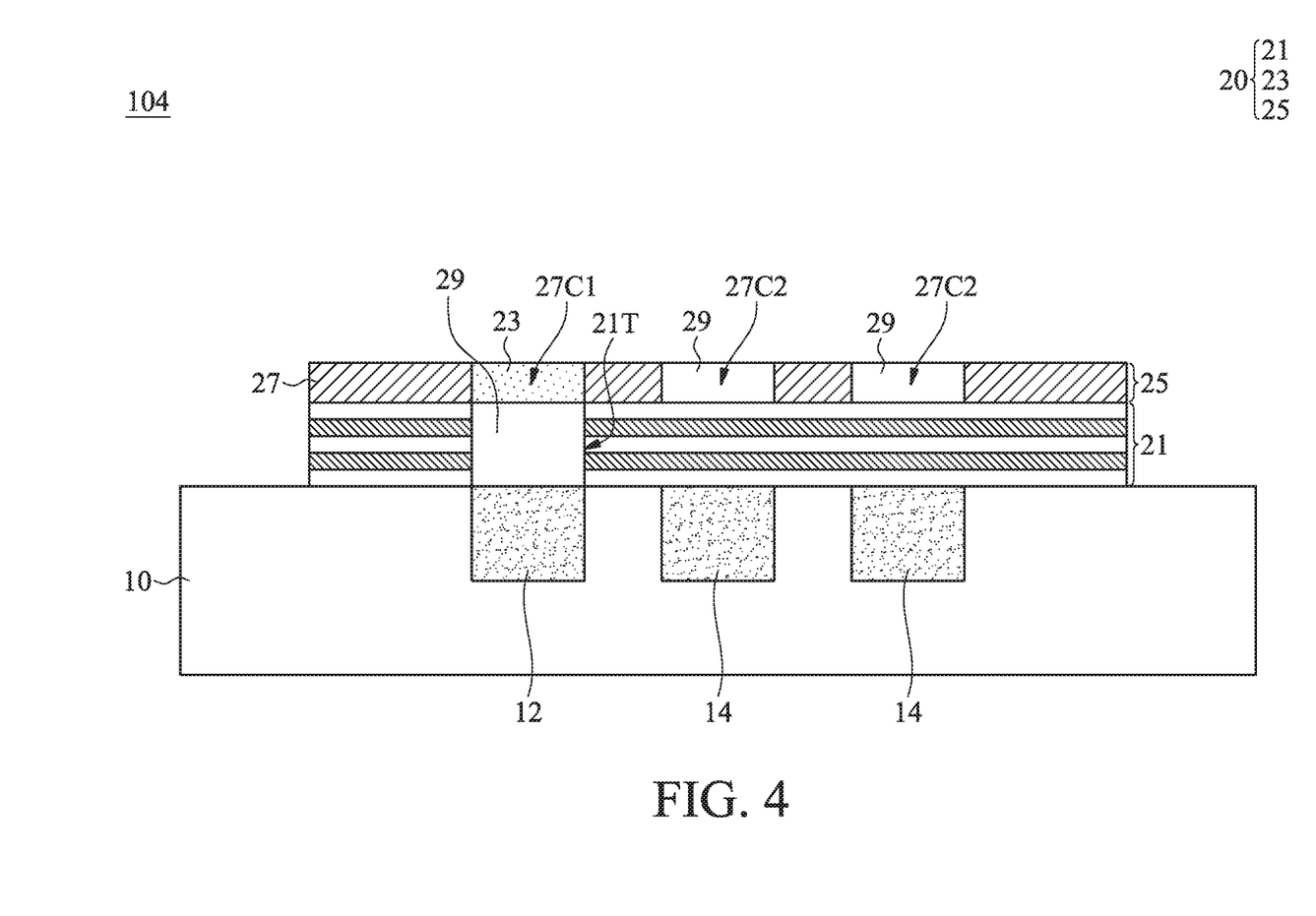
FIG. 4 is a partial cross-sectional view illustrating a semiconductor device according to an embodiment of the present disclosure.

FIG. 4 is a partial cross-sectional view illustrating a semiconductor device 104 according to an embodiment of the present disclosure. It should be noted that some components may be omitted in FIG. 4, for the sake of brevity.

Referring to FIG. 4, the semiconductor device 104 has a structure similar to the structure of the semiconductor device 100 shown in FIG. 1. The difference from the semiconductor device 100 shown in FIG. 1 is that the light filter portions 23 of the semiconductor device 104 shown in FIG. 4 may replace some light-transmitting portions 29 and be disposed in the corresponding first holes 27C1. That is, the light filter portions 23 may be disposed in the first holes 27C1 that correspond to the first photoelectric conversion elements 12.

As show in FIG. 4, the light filter portions 23 may be disposed on (above) the trenches 21T of the patterned multi-film 21 (only one light filter portion 23 and one trench 21T are shown in FIG. 4). Furthermore, as shown in FIG. 4, some light-transmitting portions 29 are disposed in the trenches 21T. That is, the light-transmitting portions 29 are disposed in the trenches 21T and in the second holes 27C2, but the present disclosure is not limited thereto.

Figure 5:
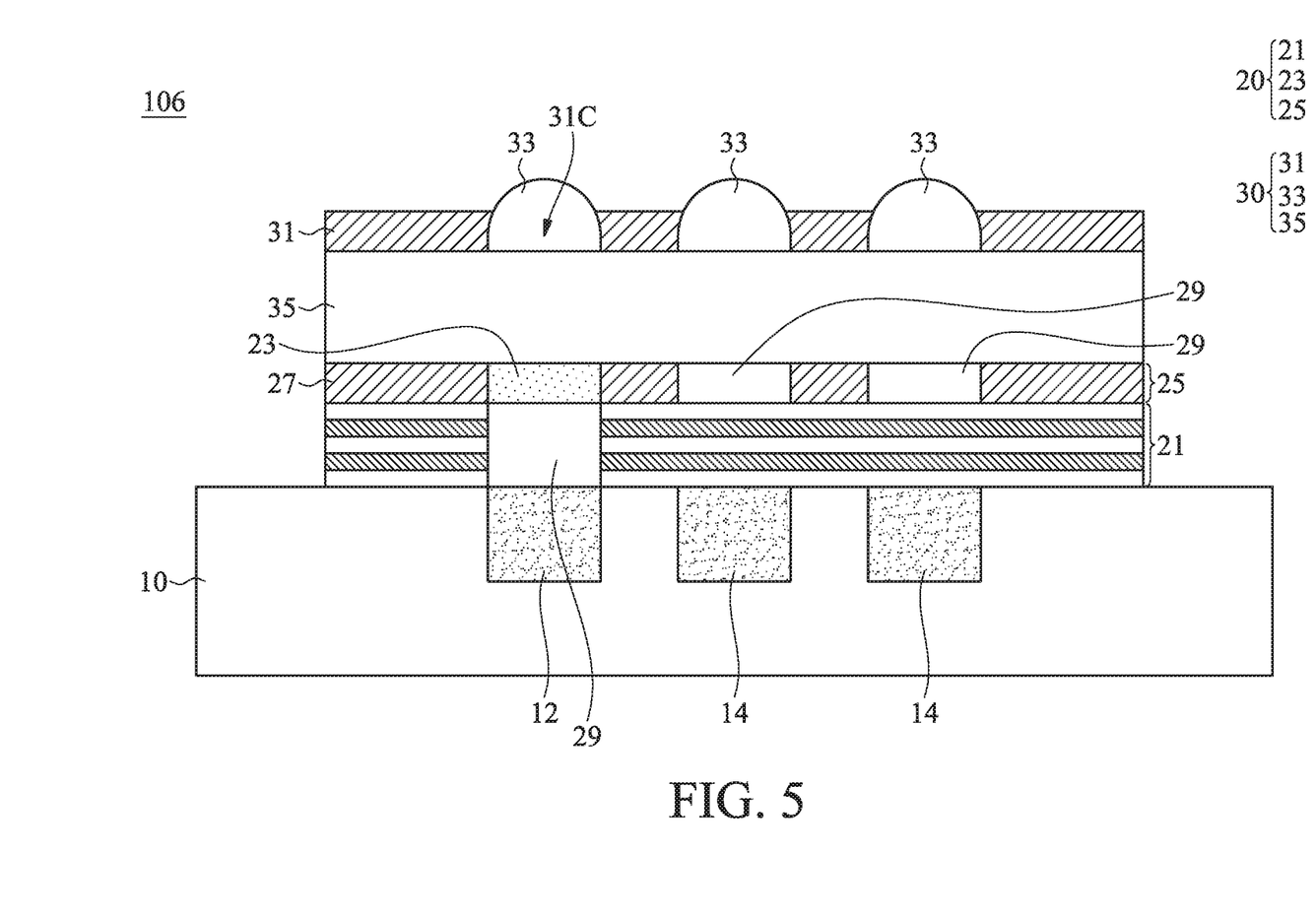
FIG. 5 is a partial cross-sectional view illustrating a semiconductor device according to another embodiment of the present disclosure.

FIG. 5 is a partial cross-sectional view illustrating a semiconductor device 106 according to another embodiment of the present disclosure. It should be noted that some components may be omitted in FIG. 5, for the sake of brevity.

Referring to FIG. 5, the semiconductor device 106 has a structure similar to the structure of the semiconductor device 104 shown in FIG. 4. The difference from the semiconductor device 104 shown in FIG. 4 is that the semiconductor device 106 shown in FIG. 5 may further include a condensing structure 30 disposed on the light-adjusting structure 20. In more detail, the condensing structure 30 is disposed on the light-collimating layer 25, but the present disclosure is not limited thereto.

Similarly, the condensing structure 30 may include a second light-shielding layer 31, a plurality of micro-lenses 33, and a transparent layer 35. As shown in FIG. 5, the second light-shielding layer 31 may have a plurality of third holes 31C, the micro-lenses 33 may be disposed in the third holes 31C, and the transparent layer 35 may be disposed between the light-collimating layer 25 and the second light-shielding layer 31, but the present disclosure is not limited thereto.

Figure 6:
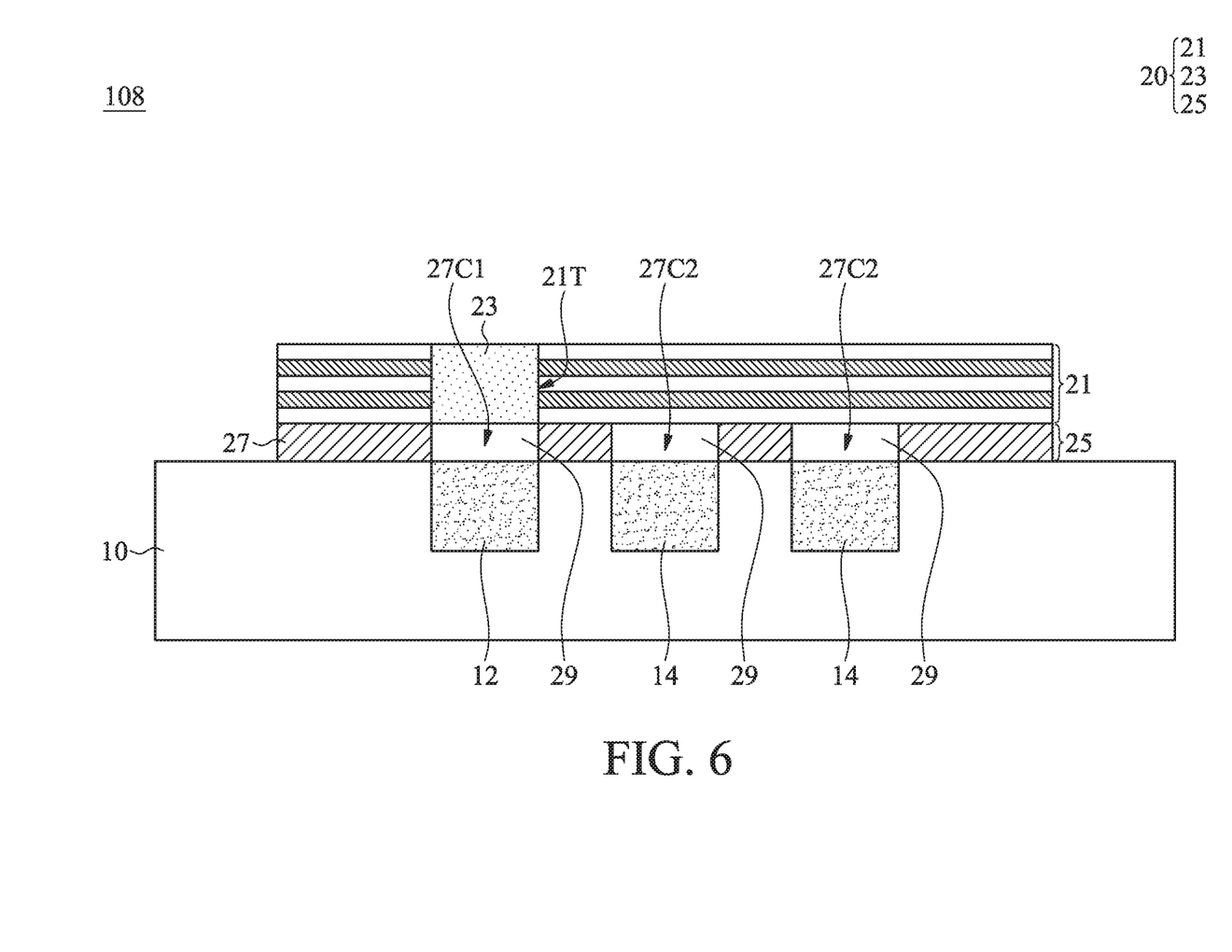
FIG. 6 is a partial cross-sectional view illustrating a semiconductor device according to an embodiment of the present disclosure.

FIG. 6 is a partial cross-sectional view illustrating a semiconductor device 108 according to an embodiment of the present disclosure. It should be noted that some components may be omitted in FIG. 6, for the sake of brevity.

Referring to FIG. 6, the semiconductor device 108 has a structure similar to the structure of the semiconductor device 100 shown in FIG. 1. The difference from the semiconductor device 100 shown in FIG. 1 is that the light-collimating layer 25 of the semiconductor device 108 shown in FIG. 6 may be disposed between the substrate 10 and the patterned multi-film 21.

Similarly, the light-collimating layer 25 may include a first light-shielding layer 27 and a plurality of light-transmitting portions 29. As shown in FIG. 6, the first light-shielding layer 27 may have a plurality of first holes 27C1 that correspond to the first photoelectric conversion elements 12 and a plurality of second holes 27C2 that correspond to the second photoelectric conversion elements 14, and the light-transmitting portions 29 may be disposed in the first holes 27C1 and the second holes 27C2. In the embodiment shown in FIG. 6, the light filter portions 23 may be disposed in the trenches 21T of the patterned multi-film 21 (only one light filter portion 23 and one trench 21T are shown in FIG. 6), but the present disclosure is not limited thereto.

In this embodiment, some light-transmitting portions 29 may be disposed between the first photoelectric conversion elements 12 and the light filter portions 23, and other transmitting portions 29 may be disposed between the second photoelectric conversion elements 14 and the patterned multi-film 21, but the present disclosure is not limited thereto.

Figure 7:
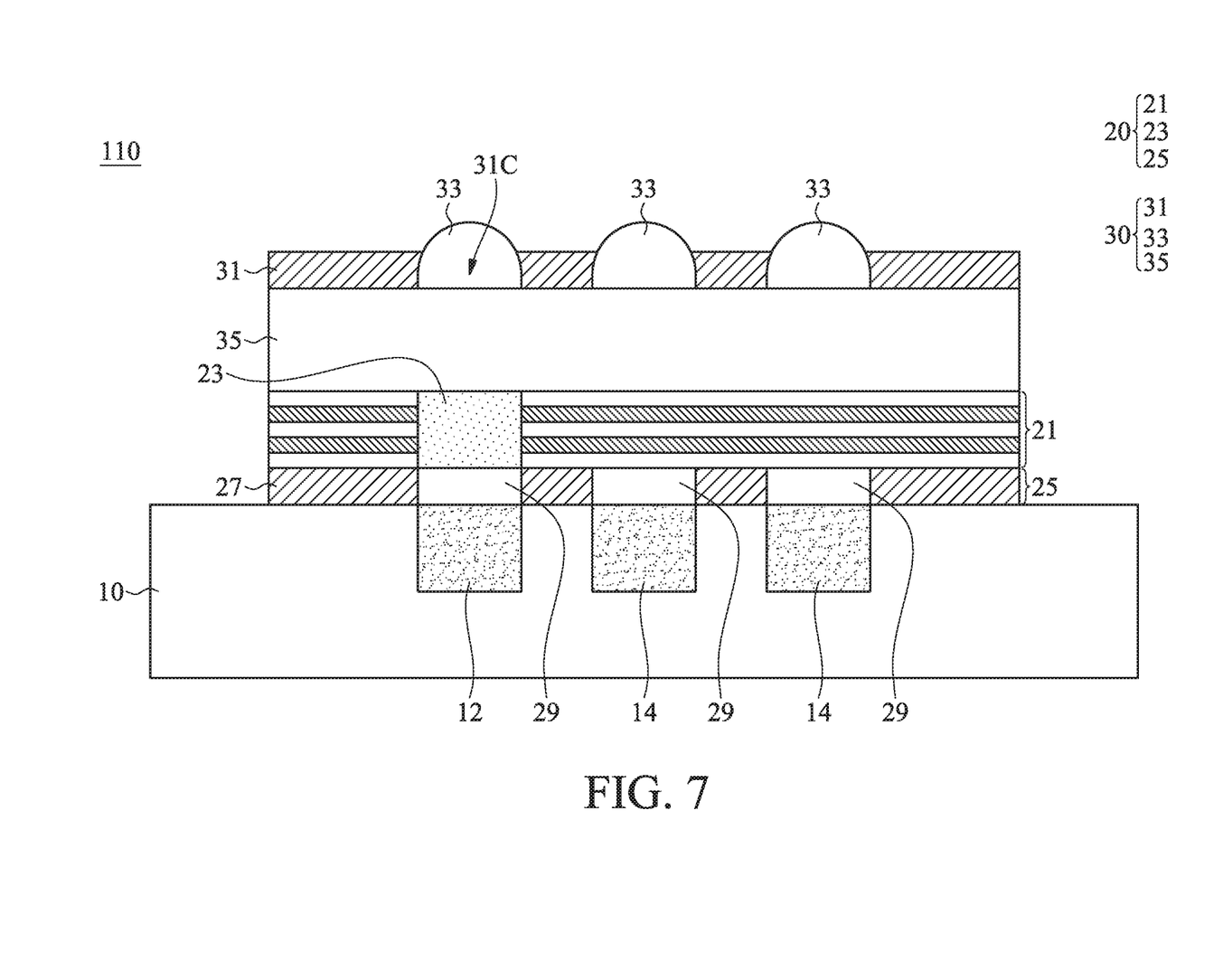
FIG. 7 is a partial cross-sectional view illustrating a semiconductor device according to another embodiment of the present disclosure.

FIG. 7 is a partial cross-sectional view illustrating a semiconductor device 110 according to another embodiment of the present disclosure. It should be noted that some components may be omitted in FIG. 7, for the sake of brevity.

Referring to FIG. 7, the semiconductor device 110 has a structure similar to the structure of the semiconductor device 108 shown in FIG. 6. The difference from the semiconductor device 108 shown in FIG. 6 is that the semiconductor device 110 shown in FIG. 7 may further include a condensing structure 30 disposed on the light-adjusting structure 20. In more detail, the condensing structure 30 is disposed on the patterned multi-film 21, but the present disclosure is not limited thereto.

Similarly, the condensing structure 30 may include a second light-shielding layer 31, a plurality of micro-lenses 33, and a transparent layer 35. As shown in FIG. 7, the second light-shielding layer 31 may have a plurality of third holes 31C, the micro-lenses 33 may be disposed in the third holes 31C, and the transparent layer 35 may be disposed between the patterned multi-film 21 and the second light-shielding layer 31, but the present disclosure is not limited thereto.

Figure 8:
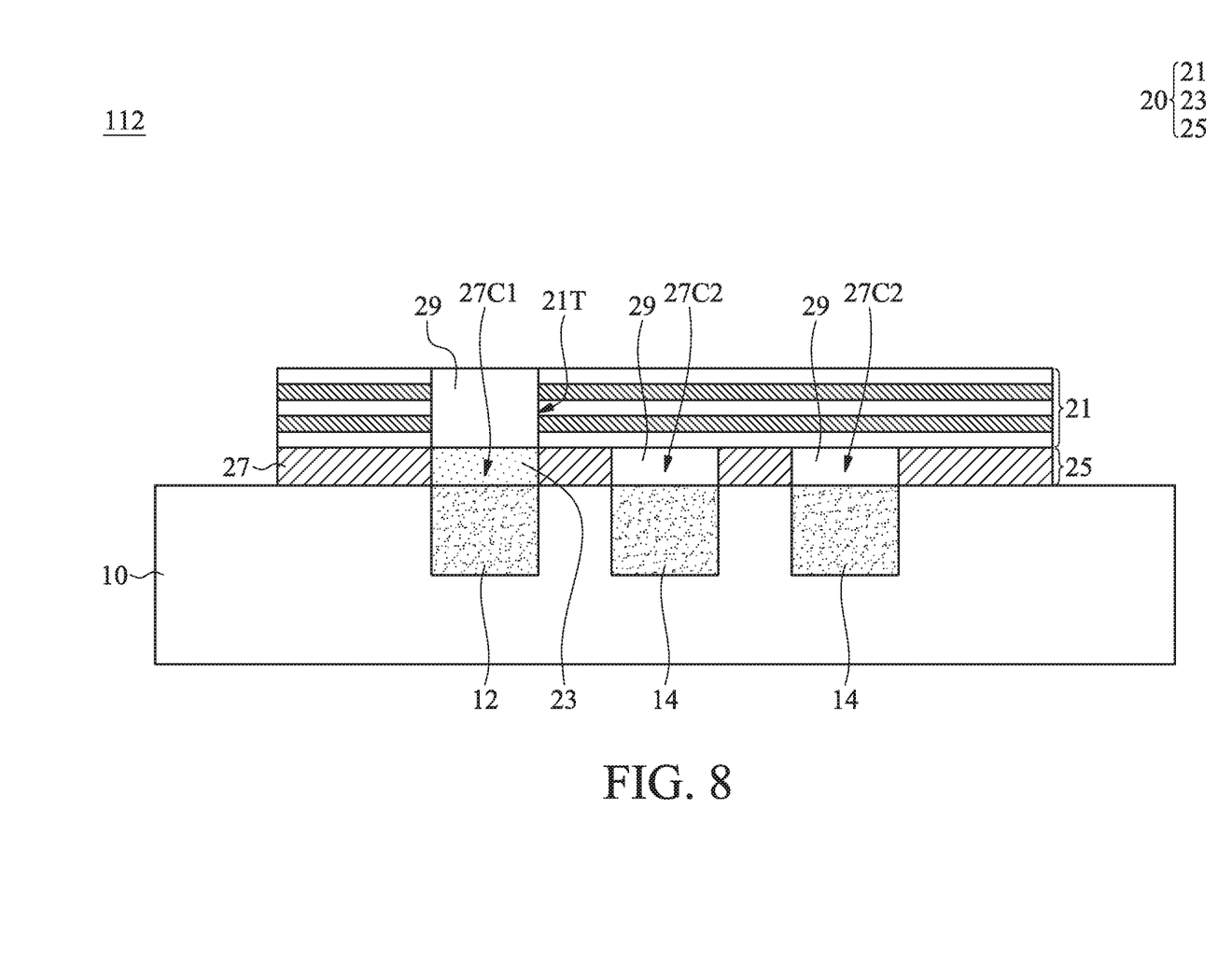
FIG. 8 is a partial cross-sectional view illustrating a semiconductor device according to an embodiment of the present disclosure.

FIG. 8 is a partial cross-sectional view illustrating a semiconductor device 112 according to an embodiment of the present disclosure. It should be noted that some components may be omitted in FIG. 8, for the sake of brevity.

Referring to FIG. 8, the semiconductor device 112 has a structure similar to the structure of the semiconductor device 108 shown in FIG. 6. The difference from the semiconductor device 108 shown in FIG. 6 is that the light filter portions 23 of the semiconductor device 112 shown in FIG. 8 may replace some light-transmitting portions 29 and be disposed in the corresponding first holes 27C1. That is, the light filter portions 23 may be disposed in the first holes 27C1 that correspond to the first photoelectric conversion elements 12.

As show in FIG. 8, the light filter portions 23 may be disposed below the trenches 21T of the patterned multi-film 21 (only one light filter portion 23 and one trench 21T are shown in FIG. 8). Furthermore, as shown in FIG. 8, some light-transmitting portions 29 are disposed in the trenches 21T. That is, the light-transmitting portions 29 are disposed in the trenches 21T and in the second holes 27C2, but the present disclosure is not limited thereto.

Figure 9:
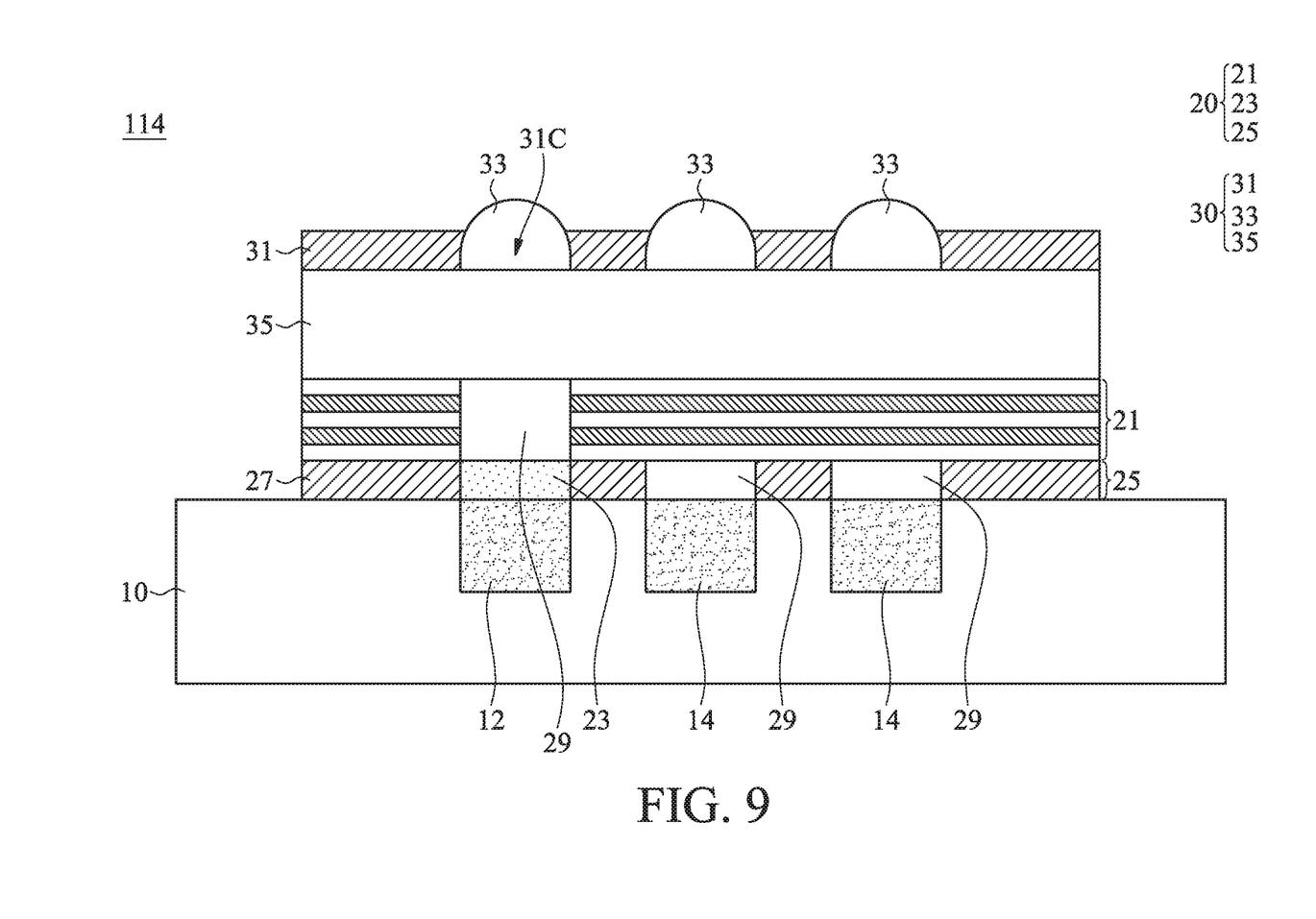
FIG. 9 is a partial cross-sectional view illustrating a semiconductor device according to another embodiment of the present disclosure.

FIG. 9 is a partial cross-sectional view illustrating a semiconductor device 114 according to another embodiment of the present disclosure. It should be noted that some components may be omitted in FIG. 9, for the sake of brevity.

Referring to FIG. 9, the semiconductor device 114 has a structure similar to the structure of the semiconductor device 112 shown in FIG. 8. The difference from the semiconductor device 112 shown in FIG. 8 is that the semiconductor device 114 shown in FIG. 9 may further include a condensing structure 30 disposed on the light-adjusting structure 20. In more detail, the condensing structure 30 is disposed on the patterned multi-film 21, but the present disclosure is not limited thereto.

Similarly, the condensing structure 30 may include a second light-shielding layer 31, a plurality of micro-lenses 33, and a transparent layer 35. As shown in FIG. 9, the second light-shielding layer 31 may have a plurality of third holes 31C, the micro-lenses 33 may be disposed in the third holes 31C, and the transparent layer 35 may be disposed between the patterned multi-film 21 and the second light-shielding layer 31, but the present disclosure is not limited thereto.

In summary, since the semiconductor device according to the embodiments of the present disclosure includes a photoelectric conversion element used for sensing near infrared light (e.g., first photoelectric conversion element mentioned above) and another photoelectric conversion element used for sensing visible light (e.g., second photoelectric conversion element mentioned above), even fake human characteristics may be made from artificial materials, the image of from fake human characteristics by near infrared light may not be the same as the image from real human characteristics by near infrared light.

Therefore, the semiconductor device according to the embodiments of the present disclosure may be able to distinguish between the fake human characteristics and the real human characteristics, so that the safety of the semiconductor device according to the embodiments of the present disclosure may be effectively enhanced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A semiconductor device, comprising:
a substrate having a plurality of first photoelectric conversion elements and a plurality of second photoelectric conversion elements; and
a light-adjusting structure disposed on the substrate, and comprising:
a patterned multi-film having a plurality of trenches that correspond to the plurality of first photoelectric conversion elements; and
a light-collimating layer directly disposed on a top surface of the patterned multi-film, wherein the light-collimating layer comprises:
a first light-shielding layer having a plurality of first holes that correspond to the plurality of first photoelectric conversion elements and a plurality of second holes that correspond to the plurality of second photoelectric conversion elements; and
a plurality of transparent segments disposed to correspond to the plurality of first photoelectric conversion elements and the plurality of second photoelectric conversion elements,
wherein the plurality of first photoelectric conversion elements are used for sensing near infrared light, and the plurality of second photoelectric conversion elements are used for sensing visible light.

2. The semiconductor device as claimed in claim 1, wherein a sensing time of the plurality of first photoelectric conversion elements during a predetermined period is shorter than a sensing time of the plurality of second photoelectric conversion elements during the predetermined period.

3. The semiconductor device as claimed in claim 1, wherein the light-adjusting structure further comprises:
a plurality of light filter portions disposed in the plurality of trenches.

4. The semiconductor device as claimed in claim 3, wherein the plurality of transparent segments is disposed in the plurality of first holes and in the plurality of second holes.

5. The semiconductor device as claimed in claim 1, further comprising:
a condensing structure disposed on the light-collimating layer.

6. The semiconductor device as claimed in claim 5, wherein the condensing structure comprises:
a second light-shielding layer having a plurality of third holes that correspond to the plurality of first photoelectric conversion elements and the plurality of second photoelectric conversion elements;

a plurality of micro-lenses disposed in the plurality of third holes; and a transparent layer disposed between the light-collimating layer and the second light-shielding layer.

7. The semiconductor device as claimed in claim 1, wherein the plurality of first photoelectric conversion elements is used for sensing a band of an electromagnetic spectrum with wavelength from 700 nm to 1100 nm.

8. The semiconductor device as claimed in claim 1, wherein the plurality of transparent segments is aligned with the plurality of first photoelectric conversion element and the plurality of second photoelectric conversion elements.

9. The semiconductor device as claimed in claim 1, wherein the transparent segments comprise transparent photoresist, polyimide, epoxy resin, or a combination thereof.

* * * * *